US009093660B2

(12) United States Patent
Yang et al.

(10) Patent No.: US 9,093,660 B2
(45) Date of Patent: Jul. 28, 2015

(54) ORGANIC LIGHT EMITTING DIODE DISPLAY DEVICE (71) Applicant: LG DISPLAY CO., LTD., Seoul (KR)

(72) Inventors: Hee-Seok Yang, Gyeonggi-do (KR); Choong-Keun Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 37 days.

(21) Appl. No.: 13/717,956

(22) Filed: Dec. 18, 2012

(65) Prior Publication Data
US 2014/0042396 A1 Feb. 13, 2014

(30) Foreign Application Priority Data

Aug. 7, 2012 (KR) .......... 10-2012-0086242

(51) Int. Cl.
H01L 51/52 (2006.01)
H01L 27/32 (2006.01)
(52) U.S. Cl.
CPC ........ H01L 51/5221 (2013.01); H01L 51/5281 (2013.01); H01L 51/5284 (2013.01); H01L 27/3244 (2013.01); H01L 27/3258 (2013.01)
(58) Field of Classification Search
None
See application file for complete search history.

(56) References Cited

U.S. PATENT DOCUMENTS

| 6,313,577 | B1* | 11/2001 | Kunisada et al. | 313/479 |
| 2002/0167268 | A1* | 11/2002 | Aruga et al. | 313/500 |
| 2005/0269942 | A1* | 12/2005 | Ahn et al. | 313/503 |
| 2008/0227357 | A1* | 9/2008 | Liu | 445/1 |
| 2010/0001301 | A1* | 1/2010 | Karg et al. | 257/98 |
| 2010/0073279 | A1* | 3/2010 | Kwon et al. | 345/107 |
| 2010/0176382 | A1* | 7/2010 | Park et al. | 257/40 |
| 2010/0182552 | A1* | 7/2010 | Park et al. | 349/114 |

FOREIGN PATENT DOCUMENTS

| JP | 2006-301101 A | 11/2006 |
| KR | 10-2010-0004224 A | 1/2010 |
| KR | 10-2012-0052914 A | 5/2012 |

* cited by examiner

Primary Examiner — Steven Loke
Assistant Examiner — Juanita B Rhodes
(74) Attorney, Agent, or Firm — Morgan, Lewis & Bockius LLP (57) ABSTRACT An organic light emitting diode display device includes: a substrate defining a plurality of pixels having a luminous area and a non-luminous area; an antireflection layer formed on the substrate and including at least one metallic layer and at least one insulating layer; a thin film transistor formed on the antireflection layer in the non-luminous area and including a gate electrode or a metal line on the antireflection layer in the non-luminous area; a passivation layer formed on the thin film transistor; a color refiner formed on the passivation layer in the luminous area; a light blocking member on the passivation layer in the non-luminous area; an organic light emitting layer; and a cathode and an anode electrodes.

23 Claims, 5 Drawing Sheets

FIG. 1

Related Art

ORGANIC LIGHT EMITTING DIODE DISPLAY DEVICE

This application claims the priority benefit of Korean Patent Application No. 10-2012-0086242, filed on Aug. 7, 2012, which is hereby incorporated by reference in its entirety.

BACKGROUND

1. Field of the Disclosure

The present disclosure relates to an organic light emitting diode display device, and more particularly, to an active matrix type organic light emitting diode display device.

2. Discussion of the Related Art

Recently, with rapid development of information technologies, flat panel display (FPD) devices having thin profiles and light weight have been suggested and actively pursued. The flat panel display devices are represented by liquid crystal display devices and organic light emitting diode display devices. The organic light emitting diode display devices may be referred to as organic electroluminescent display devices. Since the organic light emitting diode display devices do not need additional light sources, such as backlights of the liquid crystal display devices, but have high color reproduction ranges, the devices are thinner and display sharper images than the liquid crystal display devices.

An organic light emitting diode display device includes pixels which are arranged in a screen, each of which may be comprised of sub-pixels of different colors. The sub-pixels are defined by crossing of gate lines and data lines. Each sub-pixel may be independently driven by driving elements including thin film transistors; the thin film transistors and metallic lines may be disposed in a driving element region. At this time, if the thin film transistors and the metallic lines in the driving element region reflect outside light, outer visibility may be lowered.

Figure 1:
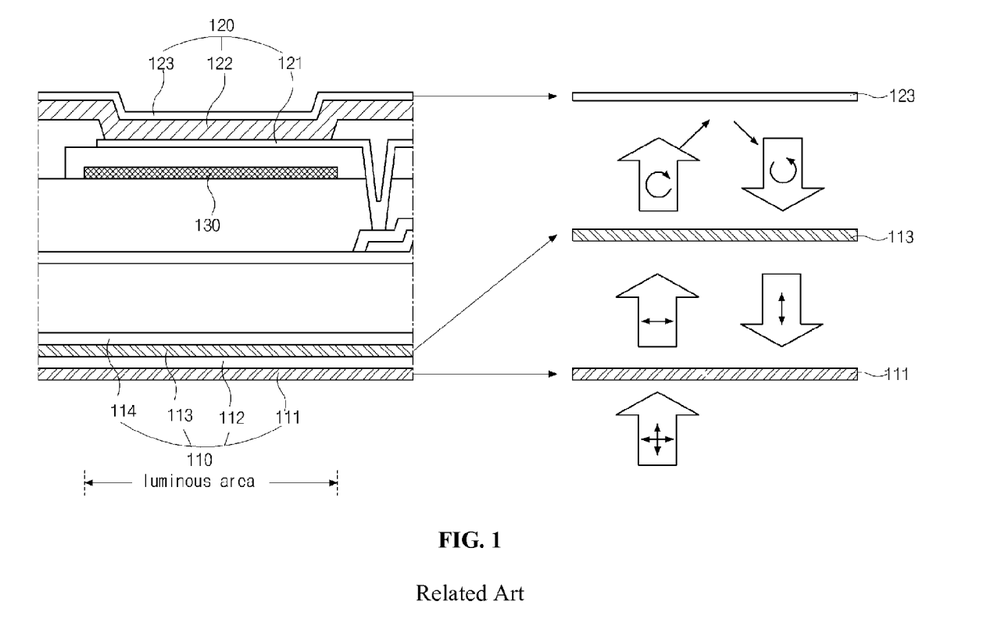
FIG. 1 is a cross-sectional view illustrating a part of an active matrix type organic light emitting diode display device according to the related art.

FIG. 1 is a cross-sectional view of illustrating a part of an active matrix type organic light emitting diode display device according to the related art.

In FIG. 1, the organic light emitting diode display device of the related art includes an organic light emitting diode 120 and a polarizer 110 formed on a substrate (not shown) through which light emitted from the organic light emitting diode 120 is transmitted to the outside.

The organic light emitting diode 120 includes an anode electrode 121, an organic light-emitting layer 122 and a cathode electrode 123.

When holes injected from the anode electrode 121 are combined with electrons from the cathode electrode 123, exitons are formed. At this time, light is emitted with a band gap energy of the organic light-emitting layer 122. The emitted light passes a color refiner 130 and is converted to a desired color.

The polarizer 110 includes a linear polarizer 111 polarizing incident light and a λ/4 phase retarder 113. The linear polarizer 111 and the λ/4 phase retarder 113 are attached to each other by a first adhesive layer 112 interposed therebetween.

Light from outside is linearly polarized through the linear polarizer 111, which may be a horizontal linear polarizer. Thus, light from the outside is horizontally polarized (linear). Furthermore, the linearly polarized light is circularly polarized through the λ/4 phase retarder 113. For example, it may be left-circularly polarized. The circularly polarized light is reflected by the cathode electrode 123 and passes through the λ/4 phase retarder 113 again. When reflected, the left-circularly polarized light is right-circularly polarized. And, through the λ/4 phase retarder 113, it is vertically polarized (linear). Since the vertically polarized (linear) light cannot pass through the horizontal linear polarizer 111, light from the outside cannot be reflected and the visibility can be improved.

A second adhesive layer 114 is formed at the outside of the λ/4 phase retarder 113 and adhere the polarizer 110 to the organic light emitting diode display device.

When the reflection of outside light is minimized using the polarizer 110, less than 45% of light emitted from the organic light emitting diode 120 is transmitted, and more than half of the brightness is deceased. Therefore, if more power consumption is used to compensate the deceased brightness, the lifetime of the organic light-emitting layer 122 is reduced.

Since the polarizer 110 is relatively expensive, adopting the polarizer 110 in order to block the reflection is not so competitive.

SUMMARY

Accordingly, the present invention is directed to an organic light emitting diode display device that substantially obviates one or more of the problems due to limitations and disadvantages of the related art.

An advantage of the present invention is to provide an organic light emitting diode display device that can reduce manufacturing costs.

An organic light emitting diode display device includes: a substrate defining a plurality of pixels having a luminous area and a non-luminous area; an antireflection layer formed on the substrate and including at least one metallic layer and at least one insulating layer; a thin film transistor formed on the antireflection layer in the non-luminous area and including a gate electrode; a passivation layer formed on the thin film transistor; a color refiner formed on the passivation layer in the luminous area; and a light blocking member on the passivation layer in the non-luminous area; an organic light emitting layer; and a cathode and an anode electrodes, wherein the light blocking member includes a light blocking layer, which is formed of the same material as the color.

In another aspect, an organic light emitting diode display device, including: a substrate defining a plurality of pixels having a luminous area and a non-luminous area; an antireflection layer formed on the substrate and including at least one metallic layer and at least one insulating layer; a metallic line on the antireflection layer in the non-luminous area; a passivation layer formed on the metallic line; a color refiner formed on the passivation layer in the luminous area; and a light blocking member formed on the passivation layer in the non-luminous area; an organic light emitting layer; and a cathode and an anode electrodes, wherein the light blocking member includes a light blocking layer, which is formed of the same material as the color refiner.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention.

DETAILED DESCRIPTION OF THE ILLUSTRATED EMBODIMENTS

Reference will be made in detail to exemplary embodiments of the present invention, examples of which are illustrated in the accompanying drawings.

Figure 2:
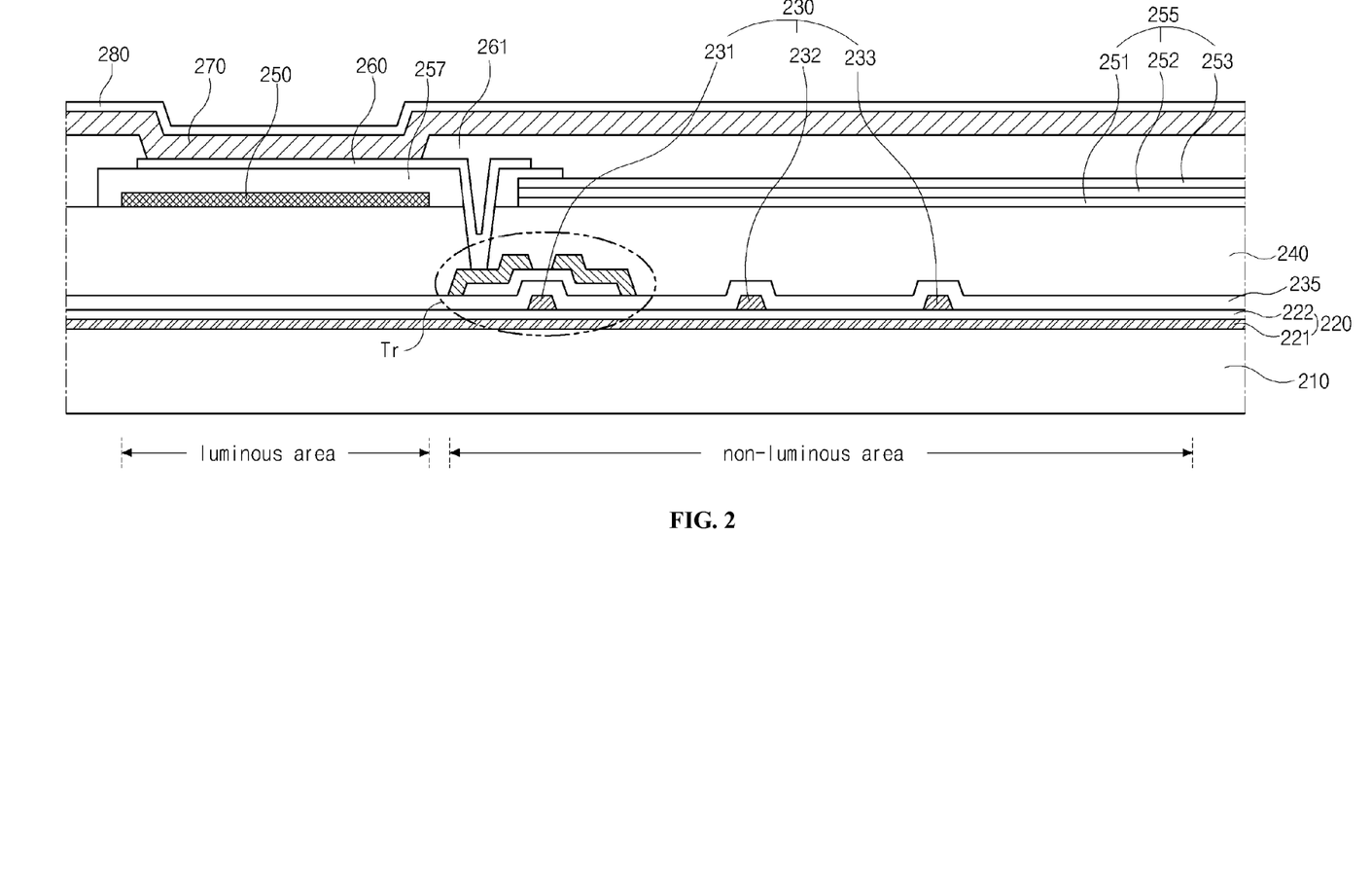
FIG. 2 is a cross-sectional view illustrating an exemplary organic light emitting diode display device having a light blocking member and an antireflection layer according to some embodiments of the present invention.

FIG. 2 is a cross-sectional view illustrating an organic light emitting diode display device according to some embodiments of the present invention.

In FIG. 2, the organic light emitting diode display device according to some embodiments of the present invention may include a substrate 210, an antireflection layer 220, a metal line 230, a passivation layer 240, a color refiner 250, a light blocking member 255, and an organic light emitting layer 270.

The substrate 210 may include a plurality of pixels, and the pixels may be divided into a luminous area and a non-luminous area. The luminous area is an area where light is emitted, and the non-luminous area is an area where there are circuits for driving the organic light emitting diode display device and light is not emitted.

The antireflection layer 220 may be formed on the substrate 210 and may minimize reflection of light from outside. The antireflection layer 220 may include at least one metallic layer 221 and at least one insulation layer 222 on the metallic layer 221. In order to enhance the reflection blocking effect, the structure of the metallic layer 221 and the insulation layer 222 may be repeated more than 2 times to have a multi-layered structure.

When the multi-layered structure is adopted, antireflection effect is excellent, but light transmittance of the organic emitting layer 270 becomes low. Thus, the number of layers may be determined by considering the antireflection and the light transmittance.

The antireflection layer 220 brings a destructive interference of light reflected on the metallic layer 221 and light reflected on the metal line 230 on the insulation layer 222, resulting in dissipation of the reflected lights. Therefore, if the metallic layer 221 and the insulation layer 222 are formed sequentially on the substrate 210 and the metallic layer 230 is formed on the insulation layer 222, the reflection of light from the outside may be prevented by destructive interference of the two reflected lights at the metallic layer 221 and at the metal line 230. At this time, the metallic layer 221 may transmit light partially, and the metal line does not transmit light. The principle of dissipation of light will be explained in detail with reference to FIG. 5 below.

Meanwhile, the antireflection layer 220 may be formed to cover the entire substrate 210. In most of the non-luminous area inside the pixel, the metal lines are formed, which may cause increased reflection of light from outside. The metal lines 230 of the non-luminous area may include a gate line 232 formed simultaneously with a gate electrode 231, and a compensation circuit line 233. Further, a gate insulation layer 235 may be formed to cover gate electrode.

Since there are many metals in most areas of the substrate 210, the antireflection layer 220 may be formed to cover the entire substrate 210. However, since the antireflection layer 220 may absorb light emitted from the organic light emitting layer 270 in the luminous area, the layer 220 may cause a decrease in the brightness of light. It is possible to form the antireflection layer 220 only in the non-luminous layer by using an additional photolithography process, which will be explained later with reference to FIG. 4 below.

As explained above, the metal lines 230 may be formed in the non-luminous area of the substrate 210. The metal lines may include the gate electrode 231 of a thin film transistor, the gate line 232 and the compensation circuit line 233. The compensation circuit line 233 shown in the drawing is a part of an entire compensation circuit, and may be a storage capacitor or a line to be connected to the storage capacitor. However, according to this invention, the metal lines are not limited and may be any line simultaneously formed with the gate electrode 231 or other lines on the same layer.

Also, the metal lines 230 may include a line separated from the gate electrode 231 engaging at least one insulation layer. For example, a data line which defines the pixel area with the gate line may be included, as well as any other lines formed simultaneously with the data line. Specifically, a source electrode and a drain electrode may be included. A power line for applying power to each pixel may also be included. The metal lines 230 are not limited to those explained above, any lines or portions that reflect light from the outside may be included.

Next, the passivation layer 240 may be formed on the metal line 230 and may protect the thin film transistor and the metal lines.

Then, the color refiner 250 may be formed on the passivation layer 240 in the luminous area. The color refiner 250 may be positioned in an area corresponding to an area where the organic light emitting layer 270 contacts the anode electrode 260 and the cathode electrode 280. Thus, light emitting in the luminous area may be converted to a desired color. The color refiner 250 may be recognized as the same element of the color filter of an LCD device. A planarization layer 257 covers the color refiner 250.

Meanwhile, the vertical position of the color refiner 250 may be determined according to the light emitting method. For example, in the top emission type, it may be positioned on the cathode electrode 280. And, regardless of the light emitting method, it may be positioned such that manufacturing efficiency or light emitting efficiency may be maximized.

The color refiner 250 may be formed by a photolithography process or a roll-printing process.

The photolithography process uses a photoresist having the color of each sub-pixel and has a merit of getting a desired precise pattern. For example, the color refiner 250 can be formed by coating a red photoresist on the substrate, and through exposure and development, green and blue color refiners 250 can be formed by the same method.

The roll-printing process may use a roll or a printing plate instead of a mask used in the photolithography process. An ink pattern having the color of each sub-pixel may be directly printed on the substrate. For example, the color refiner 250 can be formed by coating ink on the surface of a blanket, pressing the roll or the printing plate having a pattern that is reversed to the desired pattern, eliminating ink of undesired pattern, and printing the ink of the blanket left.

Next, the light blocking member 255 may be formed on the passivation layer 240 in the non-luminous area corresponding to the area where the metal lines 230 are formed. The light blocking member 255 may contact the thin film transistor or metal lines 230 where the passivation layer 240 is etched. The position where the light blocking member 255 is disposed is not limited, and the light blocking member 255 may contact the substrate 210. The light blocking member 255 functions to block progress of the light from between the metal lines 230.

The metal lines 230 may not be formed all over the substrate. The metal lines 230 may be separated from neighboring metal lines 230 for insulation.

Light from the outside passing through the metal lines may be absorbed in the light blocking member 255. Although a small amount of light from the outside may be transmitted, it may reflected on the cathode electrode 280 and may return to be absorbed in the light blocking member 255. Therefore, most of the light from the outside can be blocked. The principle of blocking light of the light blocking member 255 will be explained with reference to FIGS. 5 and 6 below.

In order to perform the above function, the light blocking member 255 may have different color light blocking layers. For example, the light blocking member 255 may have a red light blocking layer 251, a green light blocking layer 252 and a blue light blocking layer 253. The red light blocking layer 251 may comprise the same material as the red color refiner of the color refiners 250, the greed light blocking layer 252 may comprise the same material as the green color refiner of the color refiners 250, and the blue light blocking layer 253 may comprise the same material as the blue color refiner of the color refiners 250.

The color refiner 250 has colors corresponding to respective sub-pixels, and, for example, includes red, green, and blue. Yellow, cyan and other colors may be further included. When the three colors are stacked, they are recognized as a black color, which may absorb light from outside. In other words, if the red, green, and green light blocking layers 251, 252, and 253 are stacked, light from outside can be absorbed.

Further, the light blocking member 255 may be formed by stacking at least two layers of the color light blocking layers. For example, the light blocking member 255 may include two layers of the red and green light blocking layers 251 and 252, the red and blue light blocking layers 251 and 253, or the green and blue light blocking layers 252 and 253.

Light blocking member 255 may be formed simultaneously with the formation of the color refiner 250.

In case of photolithography process, for example, in order to form the color refiner 250, a red photoresist is coated on the entire substrate 210. Then, the red photoresist is eliminated in the area except luminous area emitting red color of the pixel. At this time, if the red photoresist is left without being eliminated in the non-luminous area of the pixel, the red light blocking layer 251 may be formed. Later, by the same method, the green and blue light blocking layers 252 and 253 may be formed in the non-luminous area of all pixels. The order of forming the light blocking member 255 is not limited. For example, the blue light layer 252 can be formed first.

In the roll-printing method, the light blocking member 255 may be formed by printing an ink pattern in the non-luminous area simultaneously with forming of the color refiner 250 in the luminous area of each pixel.

Next, the organic light emitting layer 270 may be formed on the entire substrate 210. The luminous area emitting light on the substrate 210 is the area where the organic light emitting layer 270 contacts the anode electrode 260 and the cathode electrode 280, and white light is emitted. The emitted light may pass through the color refiner 250 formed under the organic light emitting layer 270 and may be converted to have, for example, one of the color of red, green, and blue, and is emitted to the outside of the substrate 210.

The light emitting process according to some embodiments of the present invention is as follows. If a current of the direction of easy flow is applied to the anode electrode 260 and the cathode electrode 280, the holes from the anode electrode 260 and the electrons from the cathode electrode 280 may move to the organic light emitting layer 270 and may be recombined with each other. The combined holes and electrons are called excitons. If the excitons drop to the ground state, energy may be released in the form of light, and the organic light emitting layer 270 may emit light.

According to the material of the organic light emitting layer 270, the color of the emitted light of the pixel varies. A white color is generally accomplished, for example, by mixing red, green, and blue light emitting materials or by stacking red, green, and blue light emitting materials to mix the color of light of the each material. Alternatively, a white color is also accomplished, for example, by mixing yellow, magenta, and cyan light emitting materials or by stacking yellow, magenta, and cyan light emitting materials to mix the color of light of the each material.

In some embodiments, the passivation layer may be removed (e.g. by etching) partially or completely in the non-luminous area. In additional embodiments, the passivation layer may be removed in the luminous area as well. Upon the removal of the passivation layer, the light blocking layer described herein may be directly cover some of the metal lines 230 of the present disclosure or the gate insulation layer 235.

Figure 3:
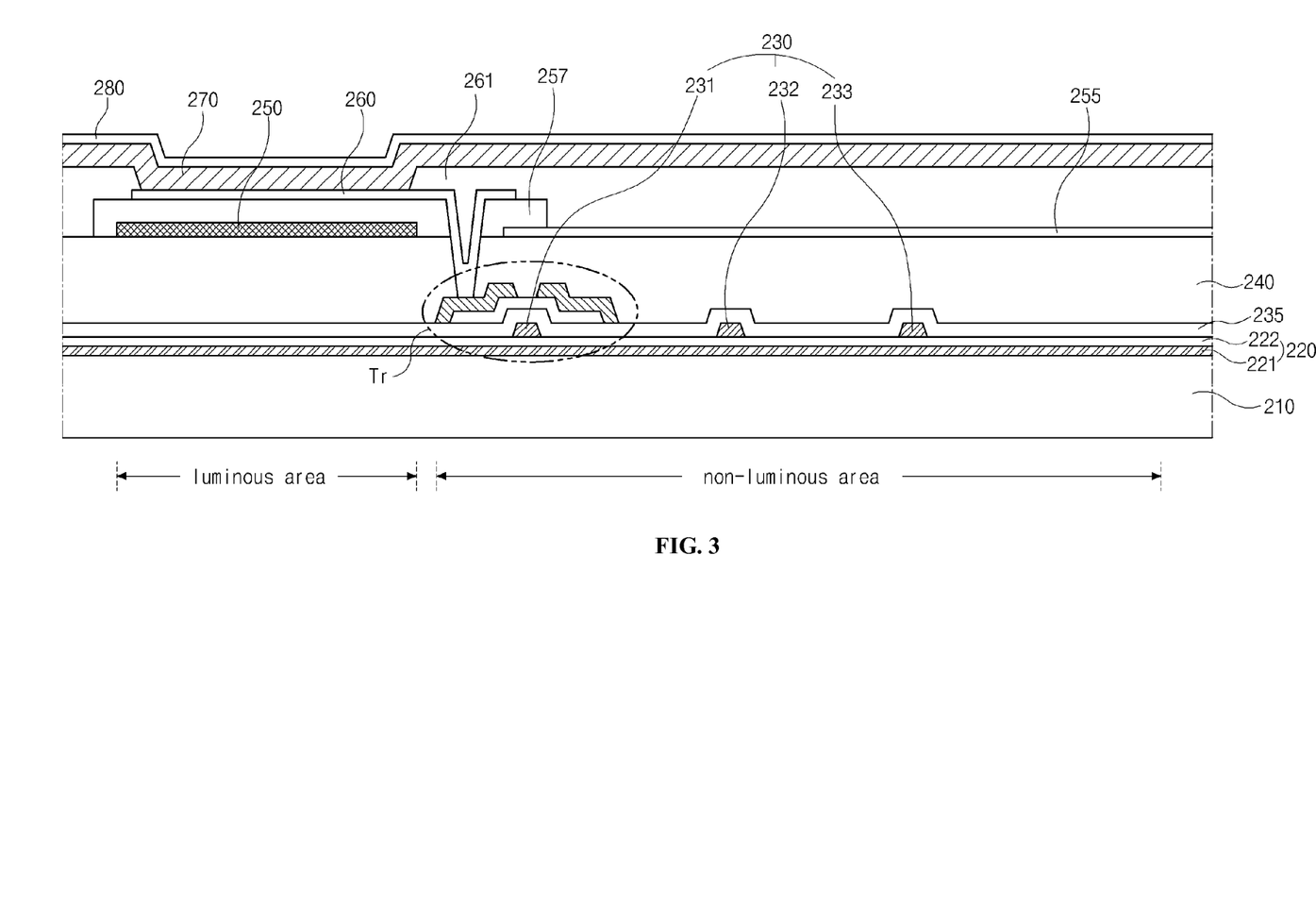
FIG. 3 is a cross-sectional view illustrating an organic light emitting diode display device including a light blocking member according to additional embodiments of the present invention.

FIG. 3 is a cross-sectional view showing a light blocking member according to additional embodiments.

As shown in FIG. 3, the light blocking member 255 may include a blue light blocking layer 253 of the same material as the blue color refiner.

The material of the blue color refiner may absorb light more than that of other color refiner. Therefore, it is not necessary to adopt the light blocking layer of the material of other color refiners to block light from the outside.

Meanwhile, in order to form the light blocking member 255 with only one layer of the blue light blocking layer 252, the red and green light blocking layers 251 and 252 formed simultaneously with the color refiner 250 may be eliminated. The color refiner 250 may be formed by coating material on the substrate 210 and eliminating the material except in the luminous area of the sub-pixel.

Figure 4:
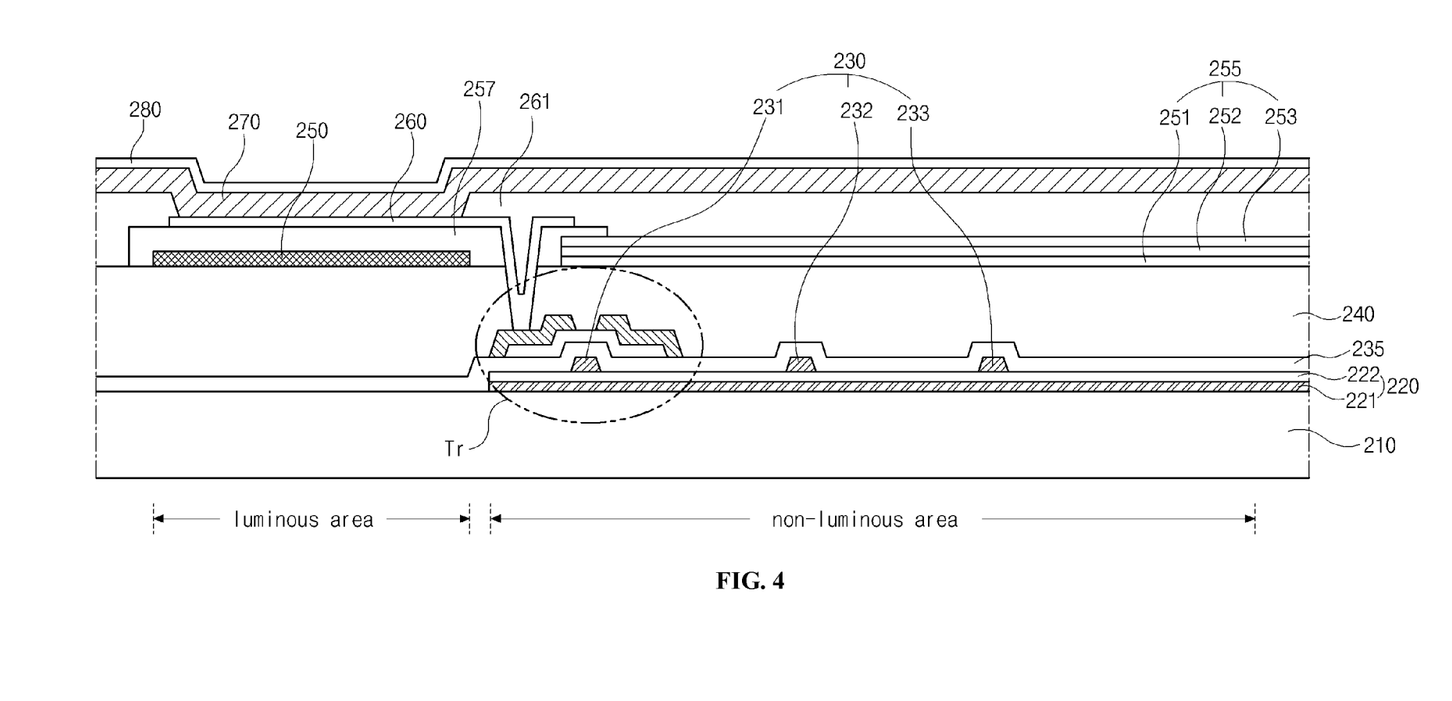
FIG. 4 is a cross-sectional view illustrating an organic light emitting diode display device including an antireflection layer according to yet additional embodiments of the present invention.

FIG. 4 is a cross-sectional view showing an antireflection layer 220 according to yet additional embodiments of the invention.

As shown in FIG. 4, the antireflection layer 220 may be formed on the substrate of the non-luminous area and may be absent from the luminous area. Since the antireflection layer 220 is not formed in the luminous area, light emitted in the luminous area may not be absorbed to the metallic layer 221 of the antireflection layer 220, resulting in increase of transmittance and brightness of light.

To form the antireflection layer 220 in the non-luminous area except the luminous area, a mask for forming the color refiner 250 or for forming a bank layer 261 may be used. Therefore, the antireflection layer 220 may be formed without preparing additional masks. In other words, in forming the antireflection layer 220, there is no need of additional manufacturing process or costs.

The detailed structure and the principle of the antireflection layer 220 are explained with reference to FIG. 5 below, which is a cross-sectional view of the antireflection layer 220.

Figure 5:
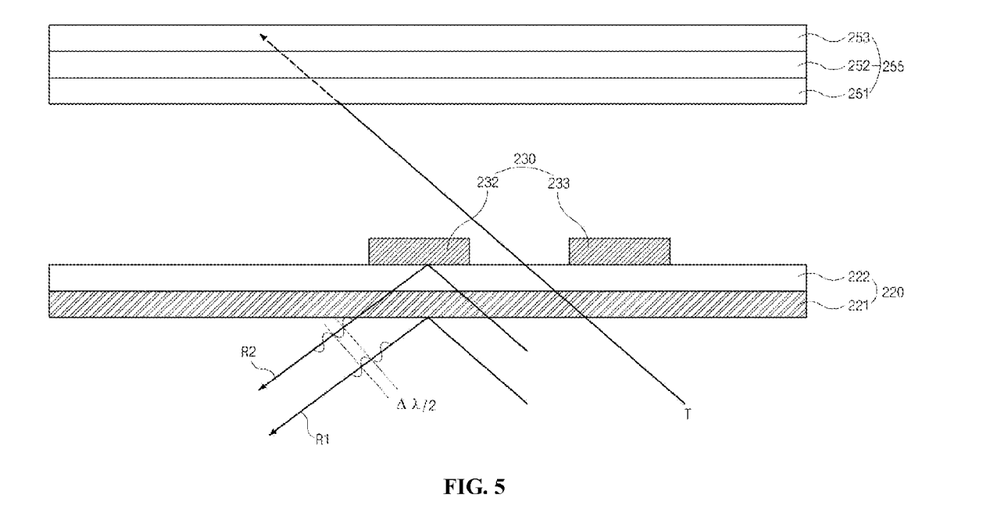
FIG. 5 is a cross-sectional view illustrating the principle of the blocking light of the light blocking member according to further embodiments of the present invention.

As shown in FIG. 5, the antireflection layer 220 has at least one metallic layer 221 and at least one insulation layer 222 where the metal lines are formed. The antireflection layer 220 is formed by stacking the metallic layer 221 and the insulation layer 222 sequentially on the substrate 210 (not shown). Under the metallic layer 221, an additional insulation layer (not shown) may be formed. And, in order to increase the effect of blocking reflection, the above structure may be repeated to have a multi-layered structure.

The processes of blocking reflection of light of the antireflection layer 220 include, for example, the following two processes. One is that of absorbing light from outside and the other is that of dissipation of light by destructive interference of light from the metallic layer 221 and light from the metal lines 230 formed on the insulation layer 222.

If the outside light incident on the substrate 210 meets the metallic layer 221, a portion of the light is reflected to be a first reflection light (R1); then another portion of the light is absorbed by the metallic layer 221, and the rest of the light is transmitted. A portion of the transmitted light may be reflected at the metallic lines to be a second reflection light (R2) and the rest of the light transmits the insulation layer 222. At this time, as shown in the figure, if the first and second reflection lights R1 and R2 have phase difference of $\lambda/2$, destructive interference may occur, and the reflection lights may be dissipated.

To cause the destructive interference, the metallic layer 221 may be made of a metallic material (e.g. titanium (Ti), molybdenum (Mo), chromium (Cr), and a mixture thereof) and may have a thickness from about 50 Å to about 200 Å, from about 80 Å to about 100 Å, or from about 50 Å to about 150 Å. If the materials formed as a thin film having a thickness of about 50 Å to about 200 Å, light may be partially transmitted, like the sun glasses or polarizing plates. Therefore, the transmitted light from the organic light emitting layer 270 may be emitted to the outside of the substrate 210.

The insulating layer 222 may be formed of an inorganic material (e.g. silicon oxide (SiOx), silicon nitride (SiNx), silicon oxynitride (SiON), aluminum oxide (AlOx) or a mixture thereof) and may have a thickness from about 500 Å to about 3000 Å, from about 800 Å to about 2500 Å, from about 1000 Å to about 1500 Å, or from about 1000 Å to about 2000 Å. The insulating layer 222 may have a refractive index from about 1.4 to about 1.7, from about 1.5 to about 1.7, or from about 1.5 to about 1.6.

For example, when the antireflection layer 220 had a multilayered structure in which the insulation layer 222, the metallic layer 221, and the insulation layer 222 having thicknesses of 800 Å, 150 Å, and 800 Å, respectively, were stacked in sequence, light transmittance was 44%, which was bigger than the polarization plate by 1%.

The thicknesses of the metallic layer 221 and the insulation layer 222 may be adjusted to cause the destructive interference. This is because the distance between the reflection points of the first and second reflection lights (R1 and R2) may determine the overlapping of peaks of the first reflection light (R1) and troughs of the second reflection light (R2). Thus, after determining thicknesses of the metallic layer 221 and the insulation layer 222, the metallic line 230 to be disposed on the insulation layer 222 may be formed to satisfy the destructive interference condition.

Further, the metallic line 230 may be formed on the different layer where the gate electrode 231 is positioned. The metallic line 230, for instance, may be a data line. In this case, to determine the destructive interference condition between the data line and the antireflection layer 220, an insulation layer, such as a gate insulation layer 235 between the antireflection layer 220 and the data line, may be considered. If the distance between the reflection points of more than two reflection lights becomes longer, it may be difficult to satisfy the destructive interference condition. By controlling distance, it is possible to get the destructive interference effect more or less.

In the condition that there exists a middle layer between the antireflection layer 220 and the metallic line 230 as explained above, it would be one of the effective ways to prevent reflection of light to form an additional antireflection layer on the middle layer and beneath the metallic line 230. For instance, when a gate insulation layer 235 exists between the antireflection layer 220 and the metallic line 230, the additional antireflection layer may be formed on the gate insulation layer 235 and beneath the metallic line 230.

Further, when the middle layer exists, an additional metallic layer on the substrate 210 corresponding to the metallic layer 230 or the metallic line 230 on the substrate 210 after etching a portion of the middle layer may be formed.

Meanwhile, the light blocking member 255 may be formed on the metal line 230. Between the light blocking member 255 and the metallic layer 230, there may exist an insulation layer, such as a passivation layer.

Light not blocked by the metallic line 230 may be absorbed and dissipated by the light blocking member 255. The transmitted light (T) is incident on the light blocking member 255 formed on the metal line 230. The light blocking member 255 has a black color. For example, the red light blocking layer 251, the green light blocking layer 252, and the blue light blocking layer 253 may be stacked to form the black light blocking member 255.

The transmitted light (T) may be absorbed and dissipated while passing through the light blocking member 255. If a part of the transmitted light (T) penetrates the light blocking member 255, it may be reflected at the cathode electrode 280 later, and may reenter the light blocking member 255 to be dissipated. By the same principle, the light blocking member 255 may prevent reflection of the transmitted light (T) between the metallic lines 230.

Figure 6:
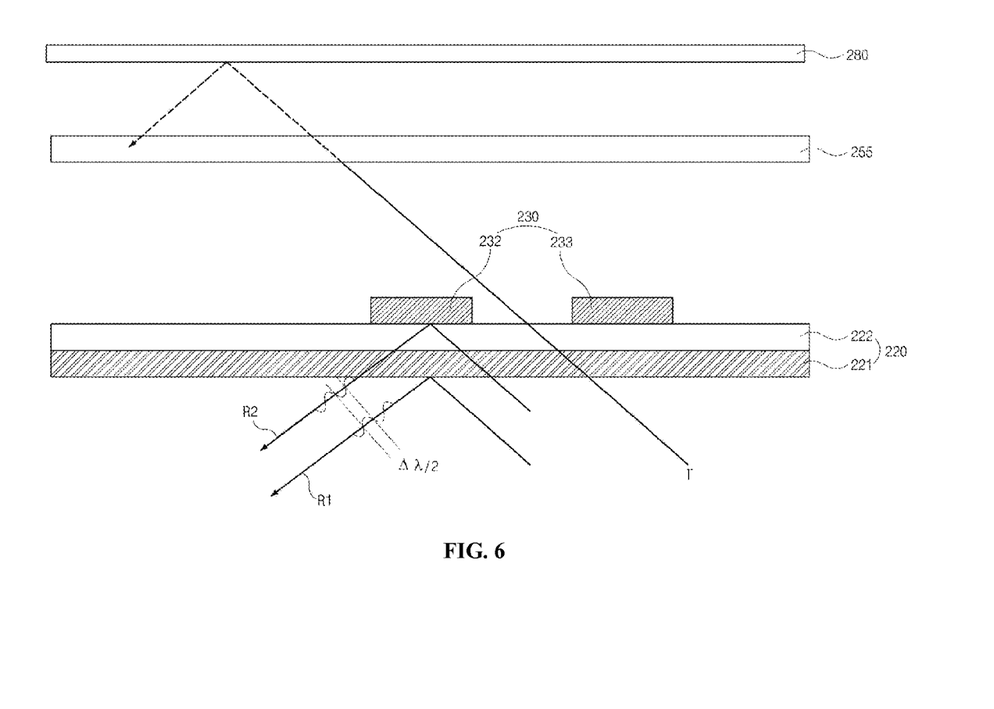
FIG. 6 is a cross-sectional view illustrating the principle of the blocking light of the light blocking member according to yet further embodiments of the present invention.

FIG. 6 is a cross-sectional view illustrating the principle of the light blocking of the antireflection layer 220 and the light blocking member 255 according to further embodiments of the invention.

As shown in FIG. 6, the antireflection layer 220 has at least one metallic layer 221 and at least one insulation layer 222. Since the principle of blocking reflection of the antireflection layer 220 is the same as that explained earlier referring to FIG. 5, the explanation is omitted.

Meanwhile, the light blocking member 255 may include a blue light blocking layer 252, which does not absorb all of the outside light but transmits light partially. Thus, the blue light blocking layer may absorb some of the outside light, and when the penetrated light is reflected by the cathode electrode 280, the blue light blocking layer may absorb the rest of the outside light.

According to the invention, by adopting the antireflection layer of multilayered structure of a metallic layer and an insulation layer instead of an expensive polarizer, the manufacturing costs may be reduced.

Further, according to the invention, since the light blocking member of the same material as the color refiner absorbs outside light transmitted between metallic lines and prevents reflection of light at the cathode electrode, the antireflection efficiency may be maximized.

Furthermore, according to the invention, by adopting the antireflection layer of high transmittance property, the power consumption may be reduced and the lifetime is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a substrate defining a plurality of pixels having a luminous area and a non-luminous area;
   an antireflection layer formed on the substrate and including at least one metallic layer and at least one insulating layer;
   a metal line on the antireflection layer in the non-luminous area;
   a passivation layer formed on the metal line;
   a color refiner formed on the passivation layer in the luminous area;
   a light blocking member formed on the passivation layer in the non-luminous area;
   an organic light emitting layer; and
   a cathode and an anode electrodes,
   wherein the light blocking member includes a light blocking layer, which is formed of the same material as the color refiner,
   wherein the antireflection layer reflects some of the light from outside to be a first reflection light and transmits some of the light from outside to the metal line, and the metal line reflects the transmitted light from the antireflection layer to be a second reflection light, and
   wherein the light blocking member is spaced apart from and non-continuous with the color refiner; and wherein a portion of a planarization layer is disposed between the light blocking member and the color refiner.

2. The organic light emitting diode display device according to claim 1, wherein the light blocking layer is formed of the same material as a blue color refiner.

3. The organic light emitting diode display device according to claim 1, wherein the light blocking member includes a plurality of light blocking layers, each having different colors from each other, and at least one of the plurality of light blocking layers is formed of the same material as the color refiner.

4. The organic light emitting diode display device according to claim 1, wherein the color refiner formed on the passivation layer in the luminous area has one color selected from a group consisting of red, green, blue, yellow, magenta, and cyan.

5. The organic light emitting diode display device according to claim 3, wherein the plurality of light blocking layers comprise red, green, and blue light blocking layers or comprise yellow, magenta, and cyan light blocking layers.

6. The organic light emitting diode display device according to claim 1, wherein the antireflection layer covers the entire substrate.

7. The organic light emitting diode display device according to claim 1, wherein the color refiner is positioned in an area corresponding to an area where the organic light emitting layer contacts the anode electrode and the cathode electrode.

8. The organic light emitting diode display device according to claim 1, wherein the metal line comprises a gate electrode of a thin film transistor, a gate line, and a compensation circuit line.

9. The organic light emitting diode display device according to claim 8, wherein the metal line further comprises a data line, a source electrode, and/or a drain electrode.

10. An organic light emitting diode display device, comprising:
    a substrate having a plurality of pixels divided into a emitting region and a non-emitting region;
    a driving element, on the substrate in the non-emitting region, including a thin film transistor and metal lines;
    an antireflection part between the substrate and the driving element, minimizing the reflection of light from outside;
    a passivation layer configured to protect the driving element, over the substrate;
    a color refiner on the passivation layer in the emitting region;
    an organic light emitting element on the substrate in the emitting region and including an anode, an organic light emitting layer, and a cathode; and
    a light absorbing part, on the passivation layer in the non-emitting region, absorbing the light through the driving element,
    wherein the light absorbing part is spaced apart from and non-continuous with the color color refiner; and wherein a portion of a planarization layer is disposed between the light absorbing part and the color refiner.

11. The organic light emitting diode display device according to claim 10, wherein the antireflection part comprises:
    a metallic layer on the substrate and configured to reflect some of the light from outside to be a first reflection light and to transmit some of the light from outside; and
    an insulation layer on the metallic layer that transmits some of the transmitted light from the metallic layer.

12. The organic light emitting diode display device according to claim 11, wherein the metallic layer and the insulation layer are stacked on the substrate.

13. The organic light emitting diode display device according to claim 11, wherein the metallic layer is partially transmitting materials and has a thickness from about 50 Å to about 200 Å.

14. The organic light emitting diode display device according to claim 11, wherein the insulation layer is inorganic material and has a thickness from about 500 Å to about 3000 Å.

15. The organic light emitting diode display device according to claim 11, wherein the metal lines are disposed on the insulation layer and reflect the transmitted light from the metallic layer to be a second reflection light.

16. The organic light emitting diode display device according to claim 11, wherein the metal lines are disposed on the insulation layer and reflect the transmitted light from the metallic layer to be a second reflection light, and wherein the first reflection light and the second reflection light have a phase difference of $\lambda/2$ to occur destructive interference.

17. The organic light emitting diode display device according to claim 10, wherein the light absorbing part includes a plurality of color refiner layers having different colors from each other.

18. An apparatus comprising:
    a substrate defined to have a luminous area and a non-luminous area, said luminous area comprising an organic light emitting layer and a color refiner that converts light emitted from said organic light emitting layer; and a structure comprising an anti-reflection member and a light blocking member, on said substrate, said structure being configured to reduce undesired light reflections from affecting said luminous area without having a polarizer attached to said substrate,
said anti-reflection member in said non-luminous area, and
said light blocking member, that is spaced apart from and non-continuous with said color refiner, only in said non-luminous area above said anti-reflection member; and
wherein a portion of a planarization layer is disposed between the light blocking member and the color refiner.

19. The apparatus of claim 18, further comprising: a passivation layer on said substrate in said luminous area and in said non-luminous area, wherein said color refiner is on said passivation layer in said luminous area, and said light blocking member is on said passivation layer in said non-luminous area, and said anti-reflection member is under said passivation layer.

20. The apparatus of claim 18, wherein said anti-reflection member is configured as a multi-layered structure having a particular number of layers depending upon anti-reflection effects to be achieved in view of light transmittance characteristics.

21. The apparatus of claim 18, wherein said anti-reflection member is additionally in said luminous area.

22. The apparatus of claim 18, wherein said light blocking member is configured as a single or multi-layered structure having a particular number of layers depending upon light blocking effects to be achieved.

23. The apparatus of claim 18, further comprising: a pixel electrode above said color refiner with said planarization layer therebetween.

* * * * *